United States Patent [19]

Ta

[11] Patent Number: 5,134,316

[45] Date of Patent: Jul. 28, 1992

[54] PRECHARGED BUFFER WITH REDUCED OUTPUT VOLTAGE SWING

[75] Inventor: Paul D. Ta, San Jose, Calif.

[73] Assignee: VLSI Technology, Inc., San Jose, Calif.

[21] Appl. No.: 626,347

[22] Filed: Dec. 12, 1990

[51] Int. Cl.$^5$ .................................. H03K 17/04
[52] U.S. Cl. .................. 307/475; 307/443; 307/481
[58] Field of Search .............. 307/443, 451, 452, 475, 307/481

[56] References Cited

U.S. PATENT DOCUMENTS 5,030,857 7/1991 Sanwo et al. ............ 307/443 X
5,036,224 7/1991 Wendell ................... 307/475

Primary Examiner—David Hudspeth
Attorney, Agent, or Firm—Hickman & King

[57] ABSTRACT

A buffer with reduced output swing characterized by a CMOS logic level compatible input, an output adapted to develop a reduced voltage swing output signal, and a precharged converter circuit coupled between the output and the input for converting the input signal to the output signal. The precharged converter circuit includes a voltage range conversion stage coupling the input to the output of the buffer and a precharger stage coupled to the voltage range conversion stage to provide the voltage range conversion stage with a ready supply of charge to quickly change the output signal in response to a change in the input signal. A method for reducing output swing on a buffer includes precharging a voltage range conversion circuit capable of developing an output signal which is variable within an output range and coupling the conversion circuit to an input signal which is variable within an input range which is larger than the output range.

15 Claims, 3 Drawing Sheets

PRECHARGED BUFFER WITH REDUCED OUTPUT VOLTAGE SWING

BACKGROUND OF THE INVENTION

This invention relates generally to electronic circuits and more particularly to buffers used in digital electronic circuits.

Digital electronic circuitry and, more particularly, highly integrated digital electronic circuitry is becoming faster, more complex, and more powerful with each succeeding generation. In very high speed digital circuitry, the ability to send signals between integrated circuit chips becomes limited by the capacitances and inductances of the leads and traces interconnecting the chips which can create noise and degrade performance. In consequence, the design of input/output (I/O) circuits becomes quite critical for high performance digital electronic circuits.

The digital buffer is an I/O circuit often used in digital electronic circuitry. Such buffers have low input capacitances, are capable of driving high capacitive loads and are characterized by signal propagation delays corresponding to the speed at which signals at their outputs can change in response to changes in signals at their inputs. With high performance digital circuitry it is desirable to have very high speed buffers, i.e. buffers which exhibit a minimum of signal propagation delay.

Another important consideration in the design of digital electronic circuitry is power consumption. In fact, a major limiting factor in the density of integrated digital circuits is the amount of power consumed by the circuitry and, therefore, the amount of heat generated by the circuitry.

It is well known that the use of Complementary Metal Oxide Semiconductor (CMOS) technology which pairs n-channel Metal Oxide Semiconductor Field Effect Transistors (MOSFETS) with p-channel MOSFETS reduces power consumption in digital circuitry when compared with similar circuitry implemented solely in n-channel or p-channel MOSFETS. However, even CMOS devices consume appreciable power and, therefore, additional methods must be utilized to further reduce power consumption in digital circuitry.

There are generally two kinds of power loss within a digital electronic circuit. Static power loss is independent of the frequency of operation of the circuit and is essentially equal to $I_{bias} \times V_{dd}$. Dynamic power loss is frequency related and is equal to $CV^2f$, where C is the total capacitance, V is the voltage level, and f is the frequency of operation of the digital circuit. The total power is the sum of the static power and the dynamic power.

Since both static and dynamic power are directly related to the voltage level, one way to reduce power consumption is to reduce the operating voltage of the digital circuitry. Standard CMOS logic levels range from zero volts d.c. (ground) to approximately five volts d.c. It is therefore possible to reduce power consumption and increase the speed of operation of a digital circuit by reducing the signal levels below five volts for portions of the circuit which are required to drive high capacitive loads.

SUMMARY OF THE INVENTION

The buffer of the present invention achieves very high speed operation through the combination of reduced output voltage swing and a precharged voltage range conversion stage. The present buffer finds applications in a number of high speed digital circuits such as high performance Application Specific Integrated Circuit (ASIC) multiple chip sets having clock rates of 100 Mhz and greater.

Briefly, the buffer includes an input coupled to an input signal which is variable within a first range of voltages, an output carrying an output signal which is variable in a smaller, second range of voltages, and a precharged voltage range conversion stage coupled between the input and the output. Typically, the first range of voltages is from about zero volts to about five volts d.c., i.e. standard CMOS logic level signals, while the second range of voltages is from about zero to about one volt or from about four volts to about five volts. Since the output voltage swing is only one fifth the input voltage swing, output logic levels of the present buffer can be reached very quickly.

The buffer also includes a precharger stage coupled to the voltage range conversion stage. The precharger stage, which includes a current source, precharges the voltage range conversion stage to provide a ready source of charge for the output. This ready source of charge allows the output signal to move even more rapidly in its limited voltage swing.

The method of this invention is to precharge a voltage range conversion circuit which is capable of developing an output signal which is variable in an output voltage range and coupling the conversion circuit to an input signal which is variable within an input voltage range which is greater range than the output voltage range. The input voltage range is preferably about five volts, while the swing of the output voltage range is preferably about one volt. In consequence, the method of the present invention increases the speed of the buffer by precharging the voltage range conversion circuit and by limiting output voltage swing.

The apparatus and method of the present invention are also advantageous in that they reduce dynamic power requirements by reducing the voltage swing on the output of the buffer. For example, by reducing the voltage swing from the standard CMOS five volt range to a one volt range, the dynamic power savings at the output of the buffer will be approximately $Cf(5^2 - 1^2) = 24Cf$.

These and other advantages of the present invention will become clear to those skilled in the art upon a study of the detailed description of the invention and of the several figures of the drawings.

DETAILED DESCRIPTION OF THE PREFERRED EMBODIMENTS

Figure 1:
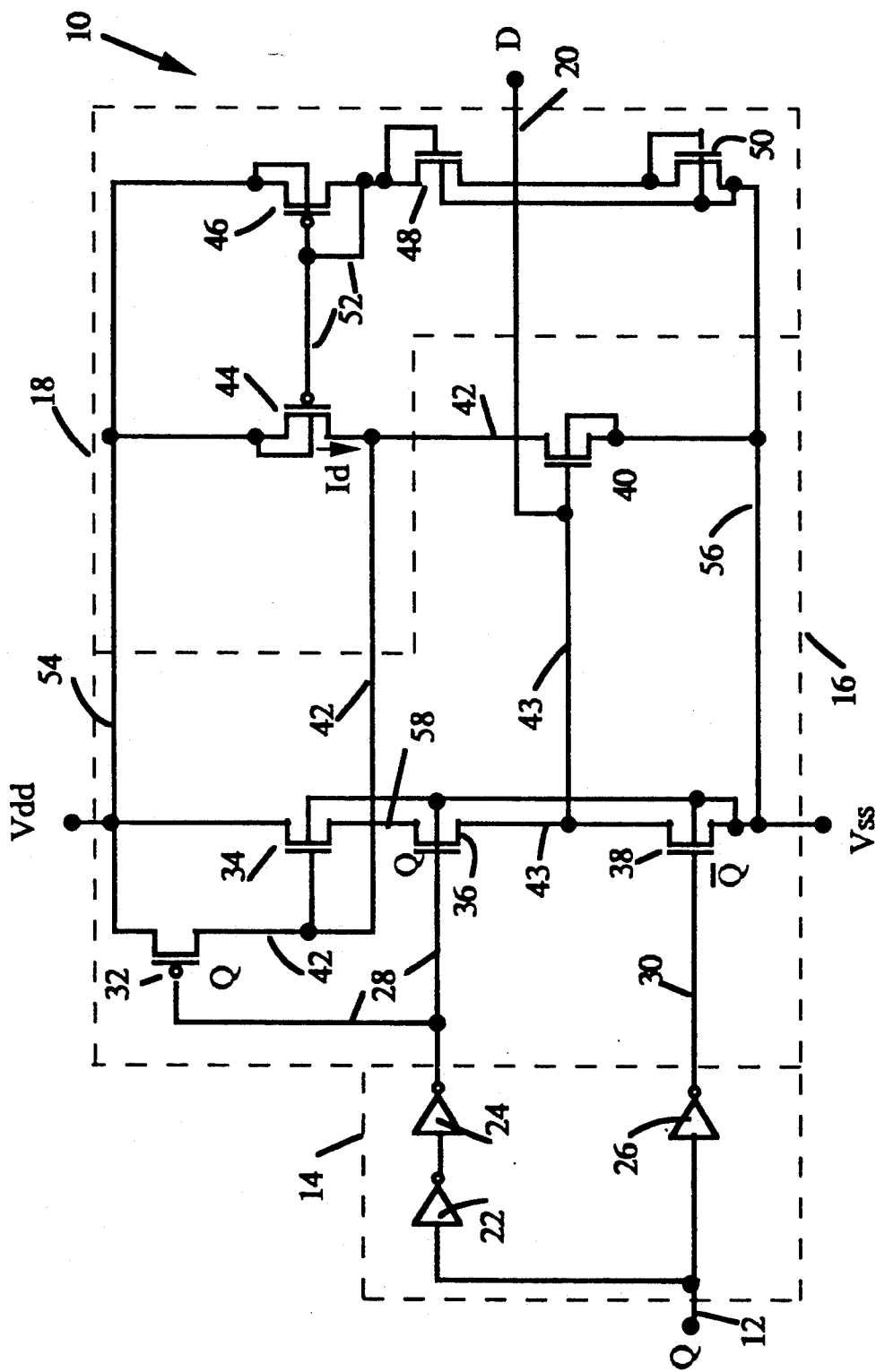
FIG. 1 is a schematic diagram of an output buffer with reduced output voltage swing in accordance with the present invention.

In FIG. 1 a buffer 10 includes an input 12, an input stage 14, a prechargeable voltage range conversion stage 16, a precharger stage 18, and an output 20. The circuitry of buffer 10 is preferably implemented in complementary metal oxide semiconductor (CMOS) technology. The input signal on line 12 varies within a first voltage range from about zero to about 5 volts d.c., i.e. the typical CMOS logic level voltage range. The output signal on output 20 has a reduced voltage swing within a smaller, second voltage range from about zero to about one volt d.c.

The input stage 14 includes three inverters 22, 24, and 26. An input signal Q will produce a signal Q on lines 28 and a signal Q on a line 30.

The voltage range conversion stage 16 includes five Metal Oxide Semiconductor Field Effect Transistors (MOSFETS) 32, 34, 36, 38 and 40. Of these MOSFETS, MOSFET 32 is a p-channel MOSFET while MOSFETS 34–40 are n-channel MOSFETS. Line 28 is coupled to the gates of MOSFETS 32 and 36 and line 30 is coupled to the gate of MOSFET 38. The gate of MOSFET 34 is coupled to the drain of MOSFET 32 by a line 42, while the gate of MOSFET 40 is coupled to the source of MOSFET 36 and the drain of MOSFET 38 by a line 43.

Precharger stage 18 includes four MOSFETS 44, 46, 48, and 50. Of the four MOSFETS, MOSFETS 44 and 46 are p-channel MOSFETS while MOSFETS 48 and 50 are n-channel MOSFETS. The gates of MOSFETS 44 and 46 are coupled together by a line 52 and are also coupled to the drain of MOSFET 48. The gates of MOSFETS 48 and 50 are coupled to their respective drains.

In operation, a positive voltage source $V_{dd}$ of about five volts d.c. is coupled to a power bus 54 while the negative voltage source $V_{ss}$ is coupled to the ground bus 56. An input signal Q is applied to input 12 to provide a corresponding output signal D on output 20.

An important aspect of this invention is the ability to precharge the voltage range conversion stage 16 so that the output signal D on output 20 can move rapidly in response to a corresponding movement of input signal Q on input 12. To accomplish this, precharger stage 18 serves as a constant current source to provide a current $I_d$ at the drain of MOSFET 44. Since the gates of MOSFETS 48 and 50 are coupled to the drains, the channels of these MOSFETS serve essentially as resistances. MOSFETS 46, 48, and 50, therefore, create a resistive divider which develops a voltage of $V_b$ on line 52 to bias the gate of MOSFET 44 to provide a substantially constant current $I_d$ over a portion of the operating range of MOSFET 44. Across this range, the current $I_d$ will be approximately equal to $$I_d = \frac{\beta S}{2} (|V_{gs}| - |V_t|)^2$$

where $V_{gs} = V_{dd} - V_b$ and where $V_t$ is the threshold voltage of the MOSFET (typically approximately 1 volt). $I_d$, in this present example, is approximately 20 microamperes. The variable $\beta$, above, is given by $\beta = mc_{ox}$ where m is the mobility of the charge carriers and $c_{ox}$ is the gate capacitance of the MOSFETS. The variable S in the above equation is given by $S = w/l$ where w is the width of the MOSFET gates and l is the length of the MOSFET gates.

Figure 1A:
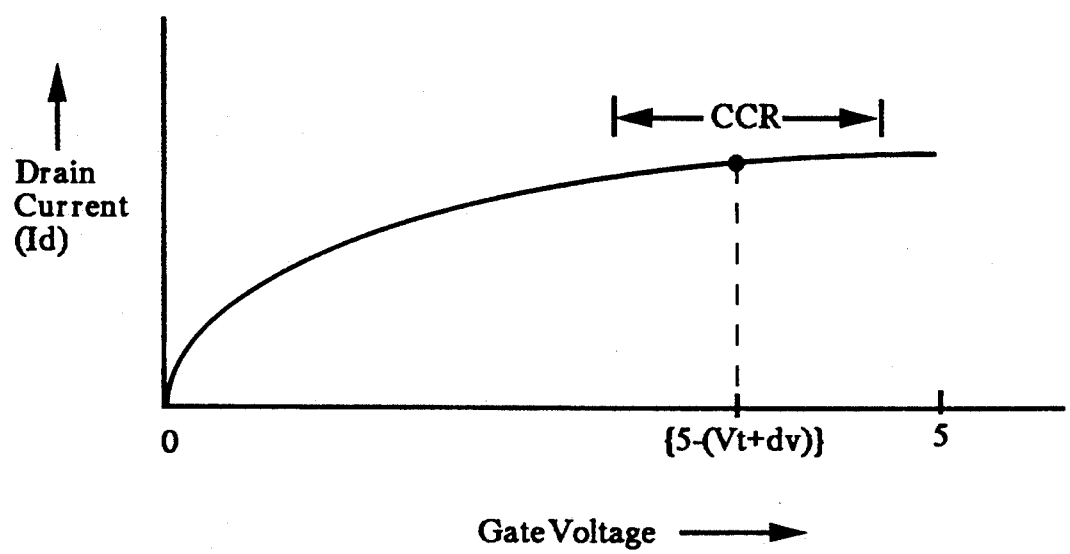
FIG. 1a is a graph illustrating the current/voltage relationship at the current source of the output buffer of FIG. 1.

FIG. 1A is a graph illustrating the relationship between the gate voltage of MOSFET 44 and the drain current $I_d$. MOSFETS 46–50 bias the gate voltage of MOSFET 44 to a level equal to $V_{dd} - (V_t + dv)$, which is approximately in the middle of a constant current region CCR. However, as can be seen in the graph, if the MOSFET 44 is operated substantially out of the constant current region CCR, it enters non-linear regions where it no longer serves as a constant current source.

When the buffer 10 is first powered under start-up condition, the voltage level on output 20 will be at or near ground, and MOSFET 40 will be shut off. Since MOSFET 44 is trying to provide a constant current $I_d$ through MOSFET 40, the voltage on line 42 is forced up to $V_{dd}$. This causes MOSFET 34 to turn on causing a line 58 to precharge to approximately $V_{dd} - V_t$ volts. As will be seen subsequently, this precharge will permit the signal D on output line 43 to move very quickly in respnose to changes in the input signal Q.

If a CMOS logical LO, i.e. approximately zero volt d.c., is applied to input 12 as the Q input signal, zero volts will be applied to the gates of MOSFETS 32 and 36 and five volts will be applied to the gate of MOSFET 38. This will turn on MOSFETS 32 and 38 and turn off MOSFET 36. By turning on MOSFET 32, the voltage level on line 42 is pulled up to $V_{dd}$— if it has fallen below that level due to a previous discharge of the line. In other words, MOSFET 32 aids the precharger stage 18 to maintain a precharge on line 42 when the Q input is LO so that the D output can quickly change when the Q input switches to HI. Since MOSFET 36 is off and MOSFET 38 is on, line 43 is pulled to ground which causes MOSFET 40 to be turned off to produce an output signal D of approximately zero volts on output 20. Since MOSFET 40 is off, constant current source 44 will continue to force the voltage level on line 42 to the aforementioned $V_{dd}$— volts.

When the Q input signal changes to a CMOS logical HI, i.e. approximately five volts d.c., five volts will be applied to the gates of MOSFETS 32 and 36, while zero volts will be applied to the gate of MOSFET 38. This will have the effect of turning off MOSFETS 32 and 38 and turning on MOSFET 36. MOSFET 34 is already on due to the precharge of $V_{dd}$— volts from the previous cycle causing the voltage level on line 43 to attempt to approach $V_{dd}$. However, the voltage level on line 43 is limited to $V_t$ because MOSFET 40 turns on at that voltage thereby causing the current $I_d$ to flow through the MOSFET 40 to ground and pulling down the voltage on line 42 to turn off MOSFET 34. Therefore, a HI logical signal Q applied to input 12 causes the voltage level on line 43 to rise extremely rapidly from 0 to $V_t$ (approximately 1 volt d.c.) due to the ready supply of charge on precharged line 58.

As noted above, the input to buffer 10 swings between zero and five volts, while the output of the buffer is limited to a swing of from zero to about 1 volt. Furthermore, the D output signal tracks the Q input signal very rapidly due to the precharge on line 58 of the voltage range conversion stage 16. Therefore buffer 10 is very fast for two reasons: first, it is much faster to move a signal within a smaller voltage range rather than a larger voltage range and, secondly, the precharge provides a ready source of charge to bring the D output signal up to its maximum level in a very short period of time.

It should also be noted that because the D output signal of buffer 10 is at lower voltage levels that less dynamic power will be consumed in subsequent circuitry. More particularly, since the dynamic power loss is equal to $CV^2f$, the dynamic power savings will be equal to approximately $Cf(V_{dd}^2 - V_t^2)$, where C is the capacitance of the circuitry and f is the frequency of operation.

Figure 2:
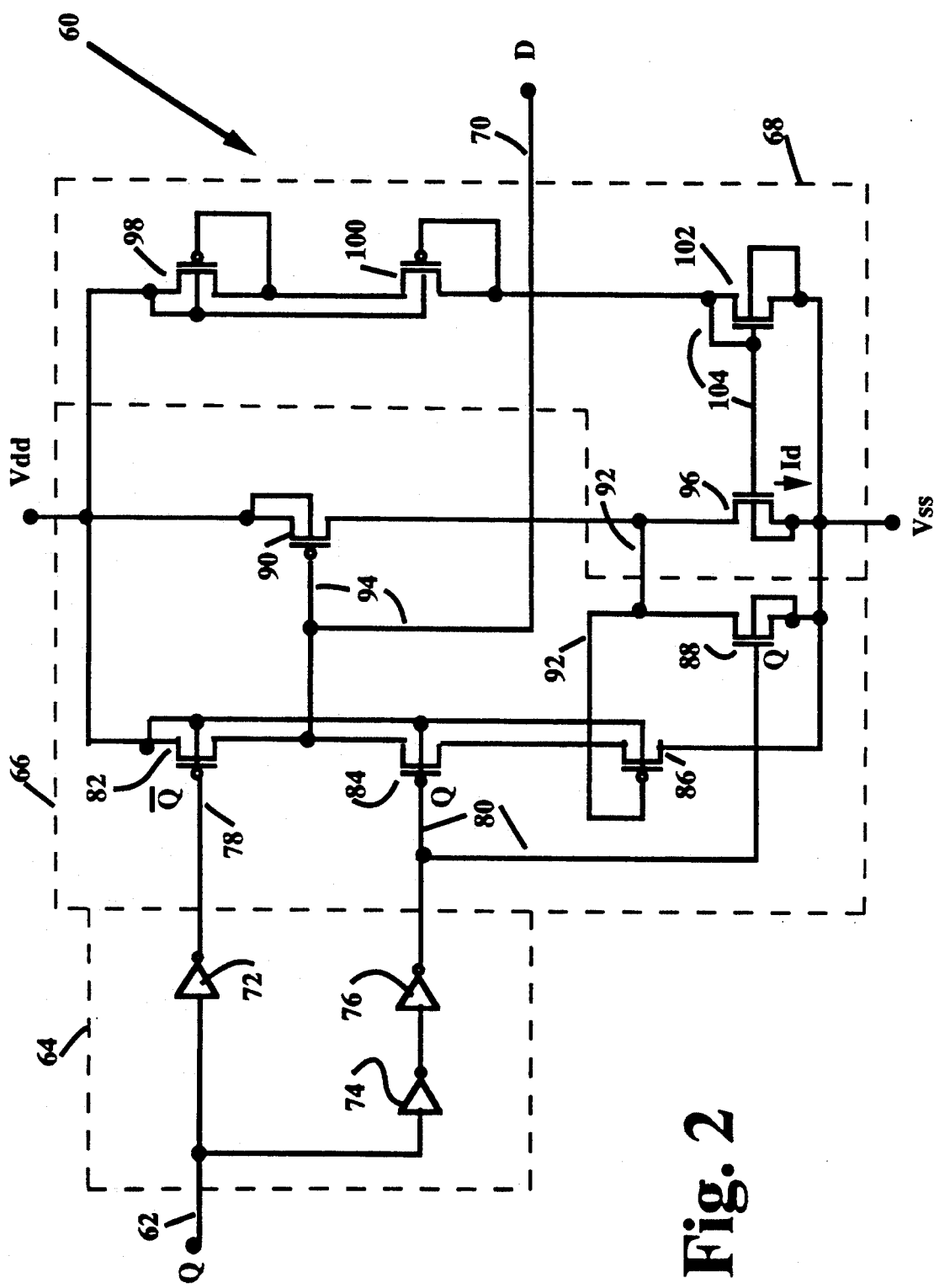
FIG. 2 is a schematic diagram of an alternate embodiment of an output buffer with reduced output voltage swing in accordance with the present invention.

FIG. 2 illustrates the complementary circuit of FIG. 1, and is used where the D output signal is desired to swing between $V_{dd}$ and $V_{dd}-V_t$. In FIG. 2, a buffer 60 includes an input 62, an input stage 64, a prechargeable voltage range conversion stage 66, a precharger stage 68, and an output 70. Again, as will be discussed in detail subsequently, the output signal D on line 70 reflects the input signal Q on line 62 but has a much smaller voltage range.

The input stage 64 includes three inverters 72, 74, and 76. Inverter 72 produces a Q signal on a line 78 while inverters 74 and 76 produce Q signals on a line 80.

Conversion stage 66 includes five MOSFETS 82, 84, 86, 88, and 90. MOSFETS 82, 84, 86, and 90 are p-channel MOSFETS while MOSFET 88 is an n-channel MOSFET. The gate of MOSFET 82 is coupled to line 78, while the gates of MOSFETS 84 and 88 are coupled to line 80. The gate of MOSFET 86 is coupled to the drain of MOSFET 88, 90, and 96 by a line 92 while the gate of MOSFET 90 is coupled to the drain of MOSFET 82, the source of MOSFET 84, and to output 70 by a line 94.

Precharger stage 68 includes four MOSFETS 96, 98, 100, and 102. MOSFETS 98 and 100 are p-channel MOSFETS, while MOSFETS 96 and 102 are n-channel MOSFETS. The gates of MOSFETS 96 and 102 are coupled together and to the drain of MOSFET 102 by a line 104, and the gates of MOSFETS 98 and 100 are coupled to their respective drains.

The operation of the buffer 60 is analogous to the operation of the buffer 10 described previously. Upon initial start-up, the voltage level on line 94 is at $V_{dd}$, causing line 92 to go to $V_{ss}$. This turns on MOSFET 86 to precharge its drain to approximately $V_t$. When a CMOS logical LO of zero volts is applied as the Q input signal on input 62, MOSFET 82 is turned off, MOSFET 84 is turned on and MOSFET 88 is turned off. Since MOSFET 86 was precharged, the output on line 94 will be quickly discharged through the transistor. However, as soon as line 94 drops to $V_{dd}-V_t$, MOSFET 90 will turn on and line 92 will rise to $V_{dd}$, removing the precharge on the gate of MOSFET 86. This limits the voltage swing on output 70 from going below $V_{dd}-V_t$.

When a CMOS logical HI of approximately five volts is applied as the Q signal at the input 62, MOSFET 82 is turned on, MOSFET 84 is turned off, and MOSFET 88 is turned on. This causes line 94 to rise to $V_{dd}$ causing output 70 to similarly rise to $V_{dd}$. The high voltage level on line 94 turns off MOSFET 90 which causes MOSFET 96 to pull down the voltage on precharge line 92 to $V_{ss}$. In consequence, the circuit of FIG. 2 provides the same high speed, low swing operation as the embodiment of FIG. 1, where the range is between $V_{dd}$ and $V_{dd}-V_t$ instead of from zero to $V_t$ volts.

It should be noted that in both embodiments of the present invention the output voltage swing or range is less than the input voltage swing or range. Other embodiments of this invention have similarly reduced output voltage swings but may have different upper or voltage range limits.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. A buffer with reduced output swing comprising:
   input means for carrying an input signal which is variable within a first range;
   output means for carrying an output signal which is variable within a second range, said second range being smaller than said first range; and
   precharged converter means coupled between said input means and said output means and operative to convert said input signal to said output signal.

2. A buffer with reduced output swing comprising:
   input means for carrying an input signal which is variable within a first range;
   output means for carrying an output signal which is variable within a second range, said second range being smaller than said first range; and
   precharged converter means coupled between said input means and said output means and operative to convert said input signal to said output signal, said precharged converter means including
   a voltage range conversion stage coupled between said input means and said output means; and
   a precharger stage coupled to said voltage range conversion stage for precharging said voltage range conversion stage, wherein said precharger stage comprises a current source.

3. A buffer with reduced output swing as recited in claim 2 wherein said first range is a voltage range of about five volts.

4. A buffer with reduced output swing as recited in claim 3 wherein said second range is a voltage range of less than about two volts.

5. A buffer with reduced output swing as recited in claim 4 wherein said voltage range conversion stage comprises precharged means and means for coupling said precharged means to said output means.

6. A method for reducing output swing in a buffer comprising:
   precharging a conversion means capable of developing an output signal that is variable within an output range, said precharging providing a steady source of charge available to quickly develop said output signal, wherein said step of precharging said conversion means includes providing said conversion means with a substantially constant source of current; and
   coupling said conversion means to an input signal that is variable within an input range, said input range being greater in range than said output range.

7. A method as recited in claim 6 wherein said input range is a voltage range of about five volts.

8. A method as recited in claim 7 wherein said output range is a voltage range of less than about two volts.

9. A buffer with reduced output voltage swing comprising:
   a voltage range conversion stage receptive to an input signal which is variable within a first voltage range and operative to develop an output signal which is variable within a second voltage range, said second voltage range being smaller than said first voltage range, wherein said voltage range conversion stage includes first sensing means for sensing said input signal, inversion means coupled to said input signal and operative to produce and inverted input signal, and second sensing means for sensing said inverted input signal; and a precharger stage coupled to said voltage range conversion stage for precharging said voltage range conversion stage.

10. A buffer with reduced output voltage swing as recited in claim 9 wherein said first voltage range is about five volts.

11. A buffer with reduced output voltage swing as recited in claim 10 wherein said second voltage range is less than about two volts.

12. A buffer with reduced output voltage swing as recited in claim 11 wherein said second voltage range is about one volt.

13. A buffer as recited in claim 9 wherein said precharger stage includes constant current means coupled to and operative to precharge one of said first sensing means and said second sensing means.

14. A buffer as recited in claim 13 wherein the other of said first sensing means and said second sensing means is operative to develop said output signal.

15. A buffer as recited in claim 14 further comprising voltage limiting means responsive to both said first sensing means and said second sensing means and operative to limit the voltage level of said output signal.

* * * * *